United States Patent [19]

Cochran

[11] Patent Number: 5,020,027
[45] Date of Patent: May 28, 1991

[54] MEMORY CELL WITH ACTIVE WRITE LOAD

[75] Inventor: David B. Cochran, Beacon, N.Y.

[73] Assignee: International Business Machines Corporation, Armonk, N.Y.

[21] Appl. No.: 505,955

[22] Filed: Apr. 6, 1990

[51] Int. Cl.$^5$ .................. G11C 11/00; G11C 11/34
[52] U.S. Cl. .................. 365/154; 365/156; 365/174; 365/225.6
[58] Field of Search ............ 365/154, 155, 156, 179, 365/174, 225.6, 175

[56] References Cited

U.S. PATENT DOCUMENTS

| | | | |
|---|---|---|---|
| 3,643,235 | 2/1971 | Berger et al. | 365/156 |
| 3,725,879 | 4/1973 | Martin | 365/49 |
| 3,801,967 | 4/1974 | Berger et al. | 365/95 |
| 3,815,106 | 6/1974 | Wiedmann | 365/72 |
| 4,158,237 | 6/1979 | Wiedmann | 365/154 |
| 4,228,525 | 10/1980 | Kawarada et al. | 365/174 |
| 4,419,745 | 12/1983 | Toyoda et al. | 365/174 |
| 4,575,821 | 3/1986 | Eden et al. | 365/154 |
| 4,607,350 | 8/1986 | Scianna | 365/154 |
| 4,754,430 | 6/1988 | Hobbs | 365/154 |
| 4,782,467 | 11/1988 | Belt et al. | 365/154 |
| 4,783,765 | 11/1988 | Werner | 365/154 |
| 4,813,017 | 3/1989 | Wong | 365/156 |
| 4,858,181 | 8/1989 | Scharrer et al. | 365/155 |

FOREIGN PATENT DOCUMENTS 2034889 1/1979 Fed. Rep. of Germany .
491998 2/1976 U.S.S.R. .

OTHER PUBLICATIONS

"Low Leakage Complementary Transistor Switch Cell," IBM Technical Disclosure Bulletin, vol. 26, No. 74, Dec. 1983, by B. W. Martin, Jr. et al., pp. 3229–3230.
"AC Write Scheme for Bipolar Random Access Memories Using Schottky Coupled Cells," IBM Technical Disclosure Bulletin, vol. 23, No. 11, Apr. 1981, by J. A. Dorler et al., 4960–4962.
"Bipolar Random-Access Memory Cell with Bilateral NPN Bitline Coupling Transistors", IBM Technical Disclosure Bulletin, vol. 10, No. 4, Sep. 1977, by J. R. Cavaliere et al., pp. 1447–1450.
"Content Addressable Storage Cell", IBM Technical Disclosure Bulletin, vol. 16, No. 12, May 1974 by H. H. Berger et al., pp. 3965–3967.
"Associative Memory Cell", IBM Technical Disclosure Bulletin, vol. 16, No. 12, May 1974, by Berger et al., pp. 3963–3964.
"Comparator with Hysteresis", IBM Technical Disclosure Bulletin, vol. 19, No. 1, Jun. 1976 by J. E. Gersbach, p. 34.
"Monolithic Associative Memory Cell", IBM Technical Disclosure Bulletin, vol. 14, No. 6, Nov. 1972, by S. K. Wiedmann, pp. 1707–1708.
"Bit Line Powered Storage Cell", IBM Technical Disclosure Bulletin, vol. 14, No. 11, Apr. 1972 by H. H. Berger et al., pp. 3542–3543.
"Bilevel Power Storage Cell", IBM Technical Disclosure Bulletin, vol. 14, No. 6, Nov. 1971, by J. J. McDowell, p. 1678.

*Primary Examiner*—Joseph A. Popek
*Assistant Examiner*—Michael A. Whitfield
*Attorney, Agent, or Firm*—Jeffrey L. Brandt

[57] ABSTRACT

A memory cell responsive to a write enable signal for storing write signals present on a pair of write bit lines and responsive to a read enable signal for presenting stored data on a pair of read sense lines further includes a timed, active write load. The memory cell includes first and second NPN bipolar transistors having commonly connected emitters, and cross-coupled bases and collectors; and first and second PNP bipolar transistors configured as loads for the pair of NPN bipolar transistors. Write transistors are provided responsive to the write enable signal for draining current from a selected one of the first or second nodes. Transistors connected as diodes between the respective PNP bases and each of the cross-coupled NPN nodes are responsive to the current draining effected by the write transistors for biasing a selected one of the first or second PNP transistors into an active mode of operation.

15 Claims, 3 Drawing Sheets

MEMORY CELL WITH ACTIVE WRITE LOAD

RELATED APPLICATIONS

The present application is related to co-pending application Ser. No. 07/505,952 by Andersen et.al., titled "Memory Cell with Active Write Load", assigned to the assignee of the present invention and filed concurrently herewith.

1. Field of the Invention

The present invention is directed generally to electronic circuits and more particularly to an electronic memory cell incorporating an active write load.

2. Background of the Invention

One common type of memory cell includes a pair of NPN bipolar transistors arranged in a cross-coupled configuration for reading (i.e. storing) and writing a pair of binary data signals responsive to selected enable signals. In one configuration, such a memory cell includes a PNP transistor connected as a load to each of the cross-coupled transistors, and various read/write access transistors for buffering data into and out of the cell.

Such memory cells typically constitute a compromise of well-known operational parameters including, but not limited to: minimizing standby current and total current requirements, maximizing the speed of various read/write operations, and minimizing the likelihood of errors in the read/write data.

Many such memory cell configurations are known in the art, several of which are briefly referenced below.

J. R. Cavaliere et.al., "Bipolar Random-Access Memory Cell with Bilateral NPN Bit Line Coupling Transistors", IBM Technical Disclosure Bulletin, Vol. 20, No. 4, September 1977, pages 1447-1450 shows several configurations of the above-described memory cell wherein PNP transistors are connected in the typical manner as passive load elements for the cross-coupled transistor pair.

U.S. Pat. No. 3,643,235 to Berger et.al. (assigned to the assignee of the present invention) shows a similar memory cell (see particularly FIGS. 4 and 8) wherein the bias characteristics of the PNP load transistors are adjustable to control the supply of the current to the cross-coupled transistors. The Berger et.al. circuits suffer from the disadvantage that the operation of the load transistors is synchronized to the operation of the bit lines in a manner that would tend to impede the rapid writing of the cell. Further, the load transistors in the FIG. 8 embodiment operate in a saturated mode that would tend to further impede the rapid operation of the cell.

U.S. Pat. No. 4,228,525 to Kawarada et.al. shows a memory cell of the type described above, i.e. with cross-coupled NPN storage transistors having PNP loads, wherein the bases of the load transistors are connected to a bulk, buried word line. This circuit suffers from the disadvantage of having the load transistors operate in a relatively uncontrolled manner which is not optimal to the operation of the memory cell.

In this field of art, any memory cell which optimizes the desirable operating characteristics of a memory cell, such as fast, low power operation, while minimizing undesirable characteristics, such as soft error rates, represents a substantial contribution to the art.

OBJECTS OF THE INVENTION

The main object of the present invention is to provide a new and improved static memory cell.

Another object of the present invention is to provide such a memory cell wherein the write cycle time is very fast while the required current consumption and likelihood of soft errors are low.

Yet another object of the present invention is to provide such a memory cell wherein the collector-base capacitances of cross-coupled storage transistors are maintained so as to inhibit soft errors while permitting very fast write operations.

A further object of the present invention is to provide such a memory cell wherein the standby current is relatively low.

SUMMARY OF THE INVENTION

In accordance with the present invention, there is provided a memory cell responsive to a write enable signal for storing write signals present on a pair of write bit lines and responsive to a read enable signal for presenting stored data on a pair of read sense lines, comprising: first and second NPN bipolar transistors having commonly connected emitters, a base of the first NPN bipolar transistor connected to a collector of the second NPN bipolar transistor at a first node, a base of the second NPN bipolar transistor connected to a collector of the first NPN transistor at a second node; first and second PNP bipolar transistors configured as loads for the first and second NPN bipolar transistors, the first and second PNP bipolar transistors having commonly connected emitters, the first PNP bipolar transistor having a collector connected to the first node, the second PNP bipolar transistor having a collector connected to the second node; current draining means responsive to the write enable signal for draining current from a selected one of the first and second nodes; and biasing means responsive to the current draining means for biasing a selected one of the first and second PNP bipolar transistors into an active mode of operation; such that the selected one of the first and second PNP bipolar transistors is activated in a timed manner to provide current to the selected one of the first and second nodes and to provide current to the collector of one of the first and second NPN bipolar transistors connected to the selected one of the first and second nodes after the current draining means has drained current from the selected one of the first and second nodes.

In accordance with another aspect of the present invention, there is provided a method of operating a memory cell responsive to a write enable signal for storing write signals present on a pair of write bit lines and responsive to a read enable signal for presenting stored data on a pair of read sense lines, the memory cell including first and second NPN bipolar transistors having commonly connected emitters, a base of the first NPN bipolar transistor connected to a collector of the second NPN bipolar transistor at a first node, a base of the second NPN bipolar transistor connected to a collector of the first NPN bipolar transistor at a second node; first and second PNP bipolar transistors configured as loads for the first and second NPN bipolar transistors, the first and second PNP bipolar transistors having commonly connected emitters, the first PNP bipolar transistor having a collector connected to the first node, the second PNP bipolar transistor having a collector connected to the second node; the method including the steps of: draining current, responsive to the write enable signal, from a selected one of the first and second nodes; and biasing, responsive to the current draining step, a selected one of the first and second PNP bipolar transistors into an active mode of operation; as such that the selected one of the first and second PNP bipolar transistors is activated in a timed manner to provide current to the selected one of the first and second nodes and to provide current to the collector of one of the first and second NPN bipolar transistors connected to the selected one of the first and second nodes after the current draining step has drained current from the selected one of the first and second nodes.

BRIEF DESCRIPTION OF THE DRAWINGS

These and other objects, features, and advantages of the present invention will become apparent from a consideration of the following detailed description of the invention when read in conjunction with the drawing Figures, in which.

DETAILED DESCRIPTION OF THE INVENTION

Figure 1:
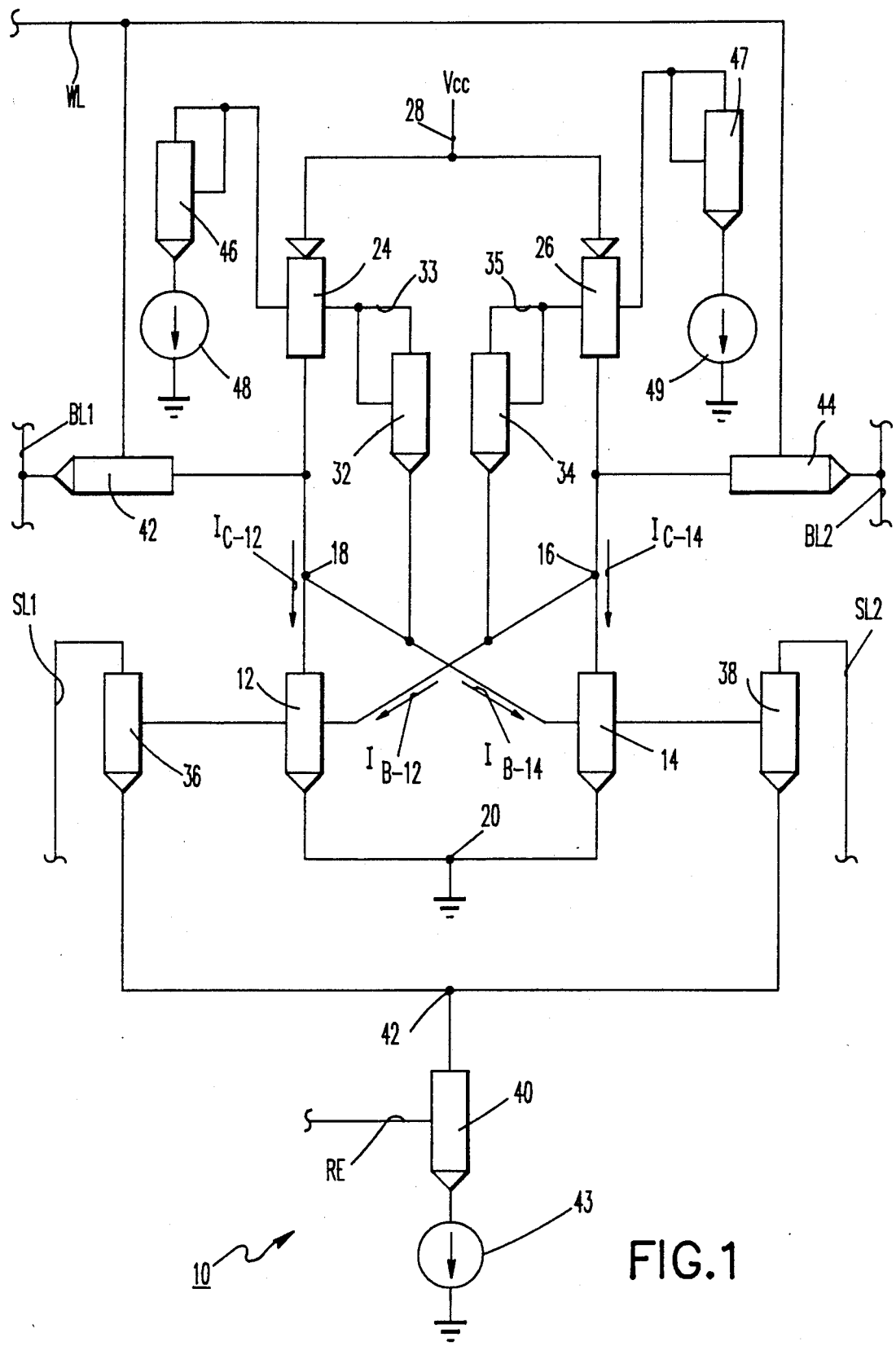
FIG. 1 is a circuit diagram of a memory cell constructed in accordance with the present invention.

Referring now to FIG. 1, a memory cell 10 constructed in accordance with the present invention includes a pair of NPN bipolar transistors 12, 14 connected in a cross-coupled, bi-stable configuration. More specifically, the base of transistor 12 is connected to the collector of transistor 14 at a node 16, while the base of transistor 14 is connected to the collector of transistor 12 at a node 18. The emitters of transistors 12, 14 are commonly connected at a circuit node 20, the node in turn being connected to ground.

A pair of PNP bipolar transistors 24, 26 are connected as loads for transistors 12, 14, respectively. More specifically, transistors 24, 26 have emitters connected in common at a circuit node 28, the node in turn being connected to a bias voltage VCC The collector of transistor 24 is connected to circuit node 18, while the collector of transistor 26 is connected to circuit node 16.

In accordance with one feature of the present invention, there is provided a pair of NPN bipolar transistors 32, 34 connected as diodes, transistor 32 having its commonly-connected base and collector connected to the base of transistor 24 at a node 33, while transistor 34 has its commonly-connected base and collector connected to the base of transistor 26 at a node 35. Transistor 32 has its emitter connected to node 18, thus functioning as a diode between nodes 33 (anode connection) and 18 (cathode connection), while transistor 34 has an emitter connected to node 16, and similarly functions as a diode between nodes 35 (anode connection) and 16 (cathode connection).

Memory cell 10 includes three NPN bipolar transistors 36, 38, 40 connected for reading data stored in transistors 12, 14. More specifically, transistors 36, 38 include emitters connected in common at a circuit node 42. The base of transistor 36 is connected to the base of transistor 12, while the base of transistor 38 is connected to the base of transistor 14. Transistor 40 has a collector connected to circuit node 42, and an emitter connected through a current source 43 to ground. The collectors of transistors 36 and 38 function as separate read sense lines SL1 and SL2, respectively. The base of transistor 40 functions as a word read enable line RE.

As yet another feature of the present invention, memory cell 10 further includes two NPN bipolar transistors 42, 44 connected for writing data into the cell. More specifically, transistor 42 has a collector connected at circuit node 18, while the collector of transistor 44 is connected at circuit node 16. The bases of transistors 42, 44 are connected in common to function as a word write enable line for receiving an externally generated write line enable signal WL, while the emitters of these two transistors function as write bit lines BL1 and BL2, respectively.

An NPN bipolar transistor 46 is connected as a diode, i.e. having commonly connected base and collector regions, with an anode at circuit node 33 and a cathode connected through a constant current source 48 to ground. Yet another NPN bipolar transistor 47 is connected as a diode having an anode (commonly connected base and collector regions) connected to node 35 and a cathode connected through a constant current source 49 to ground.

The operation of the memory cell of FIG. 1 will be described with respect to three distinct modes of operation: the standby mode, the write mode, and the read mode. These modes of operation will be described with reference to FIGS. 2 and 3.

Figure 2:
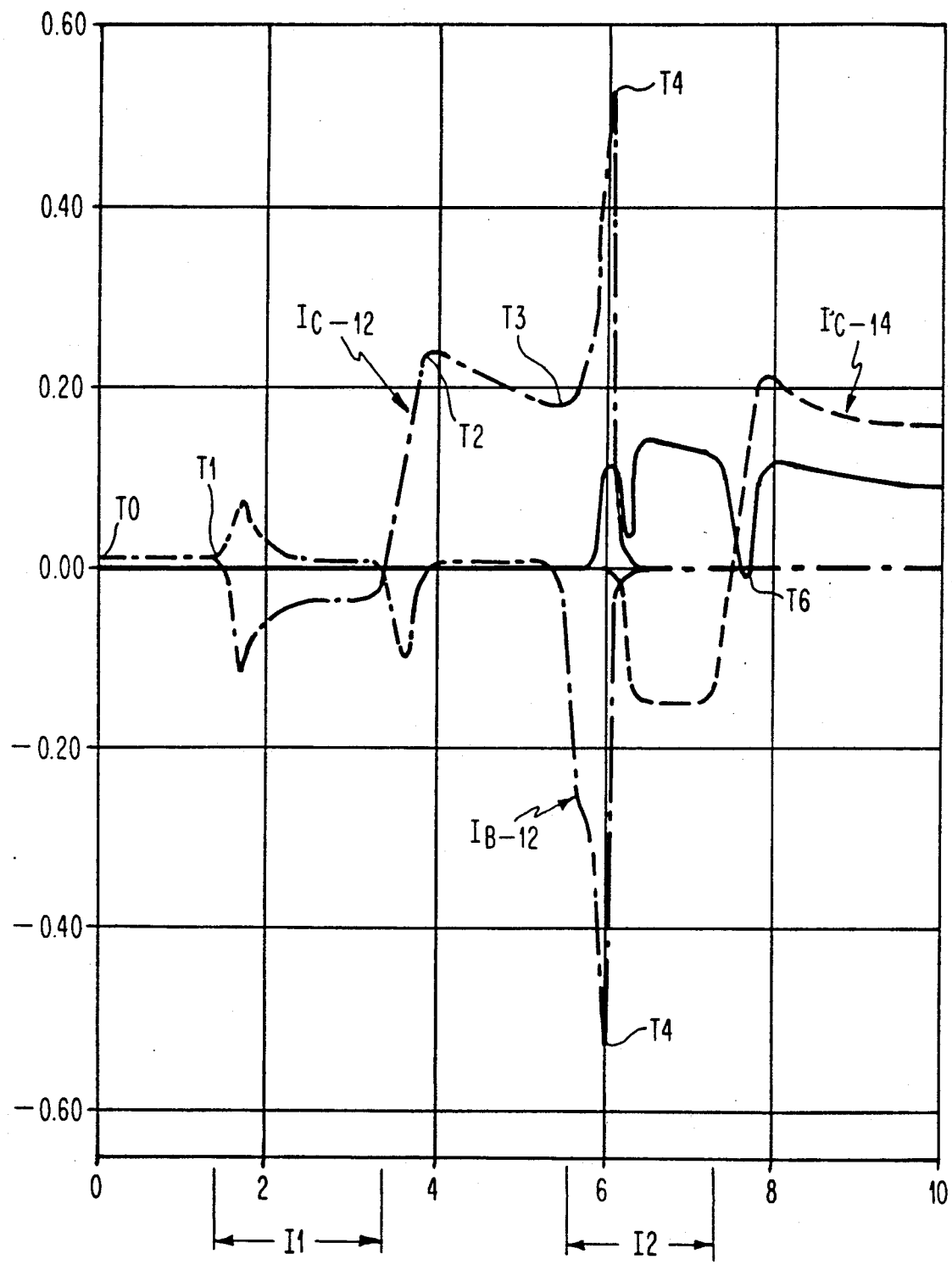
FIG. 2 is a graph showing the currents in selected legs of the circuit of FIG. 1 during two consecutive write operations.

FIG. 2 is a graph having a vertical scale of current in milliamps and a horizontal scale of time in nanoseconds. Plotted on this graph are the base and collector currents of transistor 12: $I_B$ and $I_{C-12}$, respectively, and the base and collector currents of transistor 14: $I_{B-14}$ and $I_{C-14}$, respectively.

Figure 3:
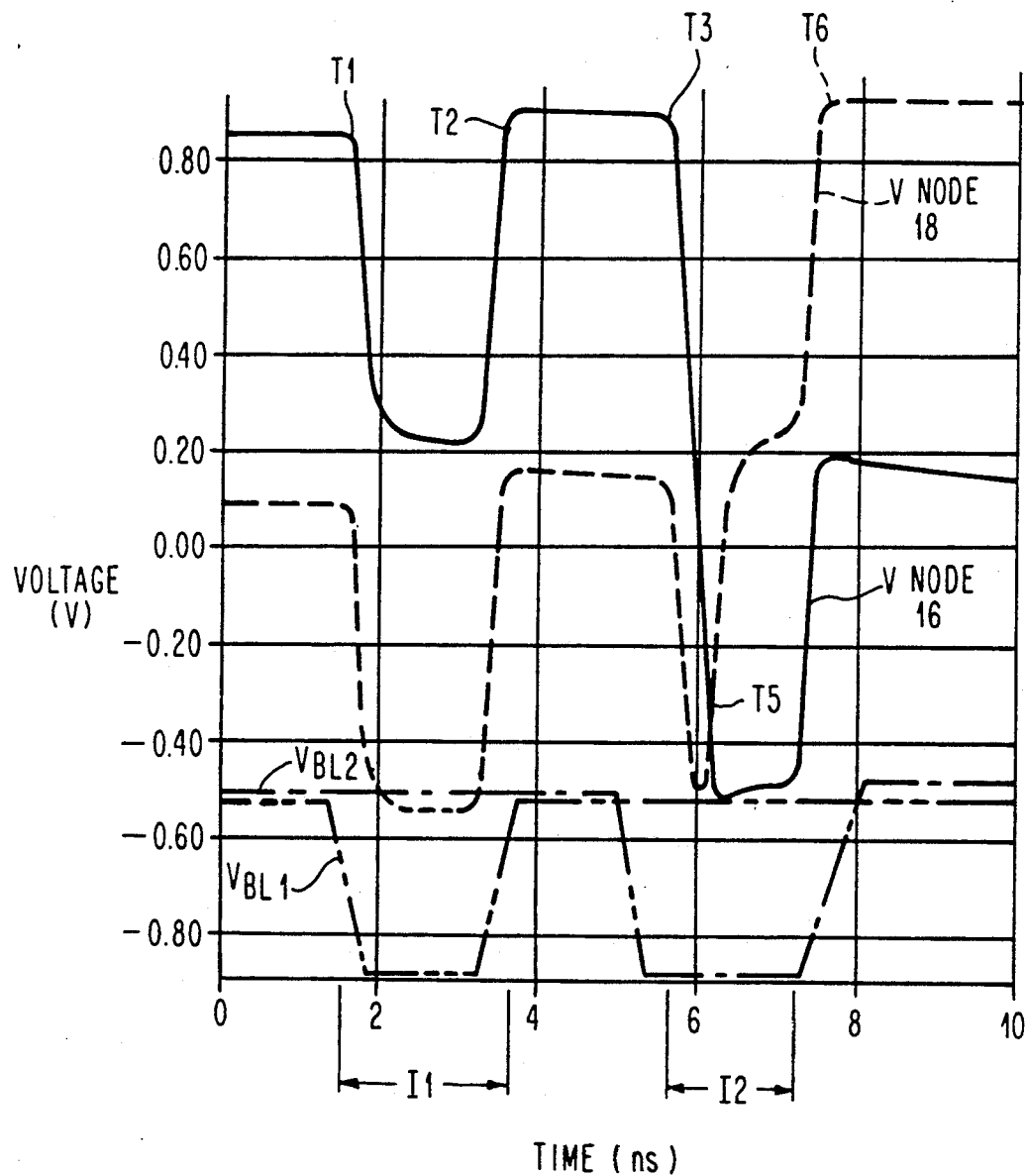
FIG. 3 is a graph showing the voltages at selected nodes in the circuit of FIG. 1 during two consecutive write operations. The same horizontal time scale is used for both FIGS. 2 and 3.

FIG. 3 is a graph having a vertical scale in volts and a horizontal scale in nanoseconds. Plotted on this graph are the voltages at circuit nodes 16 and 18: $V_{16}$ and $V_{18}$, respectively, and the voltages on bit lines BL1 and BL2: $V_{BL1}$ and $V_{BL2}$.

The time scales of the graphs of both FIGS. 2 and 3 are identical, representing the same two consecutive write cycles of memory cell 10. Where appropriate, references to activities at particular times will be indicated by like reference numbers on both FIGS. 2 and 3: i.e. TX, where X is a reference number. References to time intervals will similarly be referenced by IX.

STANDBY MODE OF OPERATION

In the standby mode of operation, shown, for example, during the time interval between 0.0 and 1.5ns, current sources 48 and 49 pull small currents through bias transistor 46 and 47, respectively. These small standby currents maintain each of load transistors 24 and 26 in a soft-ON mode of operation. This operation of load transistors 24, 26 maintains the ON transistor of the cross-coupled pair 12, 14 in saturation and with a saturated beta of approximately one (1) (i.e. with approximately equal amounts of current driven into the base and collector of the ON transistor 12 or 14). This tends to inhibit the occurrence of soft errors in memory cell 10 during the standby mode of operation. The other of the cross-coupled transistor pair 12, 14 is, of course, off.

WRITE MODE OF OPERATION

Describing now the write mode of operation with respect to the first write cycle shown in FIGS. 2 and 3, this first write, indicated by the time interval 11 between times 1.5 and 3.5 nsec, is a reinforcing write cycle wherein the data currently stored in memory cell 10 is rewritten into the cell. More specifically, during the time interval between T0=0ns and T1=1.5ns, cell 10 is in the above-described standby mode wherein the voltage at node 18 $V_{node}$ 18 is low and the voltage at node 16 $V_{node}$ 16 is high. During this standby mode of operation, transistor 14 is off, while transistor 12 is operating in a heavily saturated mode. The collector-base capacitance $C_{CB}$ of transistor 12 is charged sufficiently to make cell 10 relatively immune to soft errors.

At time T1, the beginning of the first write cycle, this status of cell 10 is reinforced by raising write line signal WL high to enable a write operation, while the voltage on bit line 1 $V_{BL1}$ is low and the voltage on bit line 2 $V_{BL2}$ is high. Current is thus sunk from circuit node 18 into bit line BL1. As can be seen within the time interval between T1 and T2=3.6ns in FIG. 2, transistor 12 is temporarily operated in an inverted mode and, for a short time, the collector current $I_{C-12}$ goes negative. During this same time interval between T1 and T2, the voltages at nodes 16 and 18 are pulled relatively lower. Because transistor 14 is off and all of the current cannot be pulled out of the collector of transistor 12, transistor 32 turns on hard, turning on load transistor 24 hard. All of the current required for bit line BL1 is then provided from transistors 32 and 24.

In accordance with a major advantage of the present invention, transistors 34 and 26 remain in the soft-ON mode of standby operation, minimizing any increase in the the collector-base capacitance $C_{CB}$ of transistor 12. With this capacitance of transistor 12 maintained substantially constant, cell 10 is quickly recovered in preparation for a subsequent write operation.

During a time interval between T2 and T3=5.5ns, cell 10 is permitted to recover. If a second write operation were not substantially immediately executed in the manner described below, the base and collector currents of transistor 12 would eventually stabilize to the standby levels as shown in the time interval between 0.0 and 1.5ns.

During a second time interval 12 between 5.5ns and 7.5ns, a write operation is performed wherein the data stored by cell 10 is reversed. More specifically, at time T3, with the voltages $V_{BL1}$, $V_{BL2}$ reversed to high, low levels, respectively, the word line signal WL is again applied to the bases of transistors 42, 44 to enable a write of cell 10. A current is sunk out of node 16, and the collector-base capacitance $C_{CB}$ of transistor 12 discharges until the base current $I_B$ reaches a peak negative of about −0.5ma at a time T4=6ns. In the time interval between T4 and a time T6=7.5ns, transistor T14 becomes temporarily inverted, with the collector current $I_{C-14}$ going negative. In a manner similar to that described above, transistors 34 and 26 turn on hard (transistors 32 and 24 staying soft-ON) to supply all of the current required by the collector of transistor 44. At time T5=6.5ns the voltages on nodes 16 and 18, $V_{node16}$ and $V_{node18}$, respectively, reverse relative polarities, going low, high, respectively.

After time T6, cell 10 recovers into a standby mode of operation, the base and collector currents of transistor 14 eventually stabilizing at standby levels.

Many of the advantages of the present invention are realized in this write mode of operation. More specifically, the operation of load transistors 24, 26 as controlled by transistors 32 and 34 functions to maintain cell 10 in a state relatively immune to soft errors, while providing fast cell recovery and response times by preventing the capacitance $C_{CB}$ of either of the cross-coupled transistors from increasing to a point wherein substantial recovery time is required between subsequent write operations. Maintaining the ON transistor in the cross-coupled pair 12, 14 in a saturated mode prevents the occurrence of soft errors, while the maintenance of the load transistors 24, 26 in an ON/unsaturated mode provides extremely fast write response. Further, because PNP load transistors 24, 26 exhibit, in their inherent operation, a slower switching frequency than do NPN's, the write enable signal applied to line WL can be terminated quickly, with the load transistors remaining ON so as to reinforce the written data. This operation of PNP load transistors 24, 26 further functions to rapidly restore cell 10 to the stable, standby mode of operation described herein above.

READ MODE OF OPERATION

In the read mode of operation, the word enable read line RE is pulled to a high voltage, turning transistor 40 on. Transistor 40, functioning as a current source, then steers current selectively through transistor 36 or 38, depending on the state of transistors 12, 14. If transistor 12 is ON (and transistor 14 is OFF), current will be steered through transistor 36. Alternatively, if transistor 14 is ON (and transistor 12 is OFF), current is steered through transistor 38. The base currents of transistors 36, 38 are supplied by transistors 26, 24, respectively. Conventional sense amplifiers (not shown) connected to sense lines SL1 and SL2 (i.e. the collectors of transistors 36, 38, respectively) are used to sense the state of memory cell 10. The status of transistors 12, 14 is unaffected by this read operation.

There is thus provided a new and improved memory cell 10 which, responsive to the initiation of a write operation, operates with self-timed, self-controlled power-up of PNP load transistors 24, 26. The ON one of cross-coupled NPN storage transistors 12, 14 is maintained in a controlled and limited saturation during write, read, and standby operations. The cell requires only a minimal standby current, which is provided in a well-regulated manner. The memory cell further exhibits the desirable characteristics of fast read and write cycle bandwidths, low power requirements, multi-port connectability, and resistance to soft errors.

The present invention has application in the fabrication of memory arrays for computing systems, and particularly for general register and cache memory systems (e.g. directories and data look-aside tables DLATS).

While the present invention has been shown and described with respect to a preferred embodiment, it will be understood that it is not thus limited. Numerous modifications, changes, and improvements, falling within the spirit and scope of the present invention will occur to those skilled in the art.

What is claimed is:

1. A memory cell responsive to a write enable signal for storing write signals present on a pair of write bit lines and responsive to a read enable signal for presenting stored data on a pair of read sense lines, comprising:
    first and second NPN bipolar transistors having commonly connected emitters, a base of said first NPN bipolar transistor connected to a collector of said second NPN bipolar transistor at a first node, a base of said second NPN bipolar transistor connected to a collector of said first NPN transistor at a second node;

first and second PNP bipolar transistors configured as loads for said first and second NPN bipolar transistors, said first and second PNP bipolar transistors having commonly connected emitters, said first PNP bipolar transistor having a collector connected to said first node, said second PNP bipolar transistor having a collector connected to said second node;

current draining means responsive to said write enable signal for draining current from a selected one of said first and second nodes; and biasing means responsive to said current draining means for biasing a selected one of said first and second PNP bipolar transistors into an active mode of operation;

such that said selected one of said first and second PNP bipolar transistors is activated in a timer manner to provide current to said selected one of said first and second nodes and to provide current to the collector of one of the first and second NPN bipolar transistors connected to said selected one of said first and second nodes after the current draining means has drained current from said selected one of said first and second nodes.

2. A memory cell in accordance with claim 1 and further including means for maintaining a selected one of said first and second of NPN bipolar transistors in a saturated mode of operation at substantially all times during a operation of said memory cell.

3. A memory cell in accordance with claim 1 and further including means for maintaining both of said first and second PNP bipolar transistors in a relatively soft ON mode of operation at substantially all times during a operation of said memory cell, said biasing means operating to bias said selected one of said first and second NPN bipolar transistors into a relatively hard ON mode of operation during a write operation of said cell.

4. A memory cell in accordance with claim 3 wherein said means for maintaining both of said first and second PNP bipolar transistors in a soft ON mode of operation includes a constant current sources connected respectively to the bases of said first and second PNP bipolar transistors.

5. A memory cell in accordance with claim 1 wherein said biasing means includes:

first means connected intermediate the base of said first PNP bipolar transistor and said first node for sinking current from the base of said first PNP bipolar transistor when said first node is at a logical low signal level; and second means connected intermediate the base of said second PNP bipolar transistor and said second node for sinking current from the base of said second PNP bipolar transistor when said second node is at a logical low signal level.

6. A memory cell in accordance with claim 5 wherein:

said first means includes a diode having an anode connected to the base of said first PNP bipolar transistor and a cathode connected to said first node; and said second means includes a diode having an anode connected to the base said second PNP transistor and a cathode connected to said second node.

7. A memory cell responsive to a write enable signal for storing write signals present on a pair of write bit lines and responsive to a read enable signal for presenting stored data on a pair of read sense lines, comprising:

first and second NPN bipolar transistors having commonly connected emitters, a base of said first NPN bipolar transistor connected to a collector of said second NPN bipolar transistor at a first node, a base of said second NPN bipolar transistor connected to a collector of said first NPN bipolar transistor at a second node;

first and second PNP bipolar transistors configured as loads for said first and second NPN bipolar transistors, said first and second PNP bipolar transistors having commonly connected emitters, said first PNP bipolar transistor having a collector connected to said first node, said second PNP bipolar transistor having a collector connected to said second node;

current draining means responsive to said write enable signal for draining current from a selected one of said first and second nodes;

a first diode having an anode connected to the base of said first PNP bipolar transistor and a cathode connected to said first node; and a second diode having an anode connected to the base of said second PNP bipolar transistor and a cathode connected to said second node.

8. A memory cell in accordance with claim 7 and further including a constant current sources connected respectively to the bases of said first and second PNP bipolar transistors.

9. A memory cell in accordance with claim 7 wherein said current draining means comprises:

a first NPN bipolar write transistor having a collector connected to said first node;

a second NPN bipolar write transistor having a collector connected to said second node;

said first and second NPN bipolar write transistors having commonly connected bases for receiving said write enable signal; and respective emitters of said first and second NPN bipolar write transistors connected for receiving said write signals.

10. A method of operating a memory cell responsive to a write enable signal for storing write signals present on a pair of write bit lines and responsive to a read enable signal for presenting stored data on a pair of read sense lines, said memory cell including first and second NPN bipolar transistors having commonly connected emitters, a base of said first NPN bipolar transistor connected to a collector of said second NPN bipolar transistor at a first node, a base of said second NPN bipolar transistor connected to a collector of said first NPN bipolar transistor at a second node; first and second PNP bipolar transistors configured as loads for said first and second NPN bipolar transistors, said first and second PNP bipolar transistors having commonly connected emitters, said first PNP bipolar transistor having a collector connected to said first node, said second PNP bipolar transistor having a collector connected to said second node; said method including the steps of:

draining current, responsive to said write enable signal, from a selected one of said first and second nodes; and biasing, responsive to said current draining step, a selected one of said first and second PNP bipolar transistors into an active mode of operation;

such that said selected one of said first and second PNP bipolar transistors is activated in a timed manner to provide current to said selected one of said first and second nodes and to provide current to the collector of one of said first and second NPN bipolar transistors connected to said selected one of said first and second nodes after the current draining step has drained current from said selected one of said first and second nodes.

11. A method in accordance with claim 10 and further including the step of maintaining a selected one of said first and second NPN bipolar transistors in a saturated mode of operation at substantially all times during the operation of said memory cell.

12. A method in accordance with claim 10 and further including the step of maintaining both of said first and second PNP bipolar transistors in a relatively soft ON mode of operation at substantially all times during the operation of said memory cell, said biasing step biasing said selected one of said first and second NPN bipolar transistors into a relatively hard ON mode of operation during the write operation of said cell.

13. A method in accordance with claim 12 wherein said step of maintaining both of said first and second PNP transistors in an ON mode of operation includes utilizing a constant current sources connected respectively to the bases of said first and second PNP transistors.

14. A method in accordance with claim 10 wherein said biasing step includes utilizing:

first means connected intermediate said base of said first PNP bipolar transistor and said first node for sinking current from the base of said first PNP bipolar transistor when said first node into a logical low signal level; and second means connected intermediate the base of said second PNP bipolar transistor and said second node for sinking current from the base of said second PNP bipolar transistor when said second node into a logical low signal level.

15. A method in accordance with claim 14 wherein:

said first means includes a diode having an anode connected to the base of said first PNP bipolar transistor and a cathode connected to said first node; and said second means includes a diode having an anode connected to the base of said second PNP bipolar transistor and a cathode connected to said second node.

* * * * *

UNITED STATES PATENT AND TRADEMARK OFFICE
CERTIFICATE OF CORRECTION

PATENT NO. : 5,020,027
DATED : May 28, 1991
INVENTOR(S) : David B. Cochran

It is certified that error appears in the above-identified patent and that said Letters Patent is hereby corrected as shown below:

Column 3, line 47,   Delete "VCC" and insert --$V_{CC}$--.

Column 4, line 36,   Delete "$I_B$" and insert --$I_{B-12}$--.

Signed and Sealed this

Twenty-fifth Day of May, 1993

Attest:

MICHAEL K. KIRK

Attesting Officer      Acting Commissioner of Patents and Trademarks